(12) United States Patent
Lee et al.

(10) Patent No.: US 6,169,426 B1
(45) Date of Patent: Jan. 2, 2001

(54) BACK BIAS VOLTAGE LEVEL DETECTOR

(75) Inventors: Jong Cheon Lee; Bong Kyun Choi, both of Cheongju (KR)

(73) Assignee: Hyundai Electronics Industries Co., Ltd., Ichon-shi (KR)

(*) Notice: Under 35 U.S.C. 154(b), the term of this patent shall be extended for 0 days.

(21) Appl. No.: 09/148,866

(22) Filed: Sep. 8, 1998

(30) Foreign Application Priority Data

Dec. 27, 1997 (KR) .................................................. 97-75451

(51) Int. Cl.[7] ........................................................ H03K 5/22
(52) U.S. Cl. ............................ 327/77; 327/318; 327/325; 327/538
(58) Field of Search ................................ 327/50–53, 56, 327/72, 74, 77, 530, 306, 309, 318, 321, 325, 538, 541

(56) References Cited

U.S. PATENT DOCUMENTS

| | | | |
|---|---|---|---|
| 5,184,030 | 2/1993 | Chung et al. | 327/530 |
| 5,336,943 | * 8/1994 | Kelly et al. | 327/513 |
| 5,719,533 | * 2/1998 | Shibuya et al. | 331/176 |

* cited by examiner

Primary Examiner—Timothy P. Callahan
Assistant Examiner—Minh Nguyen
(74) Attorney, Agent, or Firm—Fleshner & Kim, LLP

(57) ABSTRACT

A back bias voltage level detector is capable of accurately detecting a back bias voltage level by constantly maintaining a voltage inputted into a comparator using a clamp circuit or a current mirror circuit. The back bias voltage level detector includes voltage control circuitry for accurately detecting the back bias voltage and maintaining a constant input voltage to the comparator, and first and second resistors coupled in series between an electric voltage and a back bias voltage for distributing voltage inputted thereto. A comparator compares the distributed and inputted voltage with a reference voltage. A back bias voltage detector is provided for outputting a detection signal by determining that a predetermined back bias voltage is detected when the input voltage and the reference voltage are identical as a result of the comparison.

15 Claims, 3 Drawing Sheets

BACK BIAS VOLTAGE LEVEL DETECTOR

BACKGROUND OF THE INVENTION

1. Field of the Invention

The present invention relates to a back bias voltage level detector, and particularly to an improved back bias voltage level detector which is capable of detecting a back bias voltage even though an electric voltage Vcc is varied.

2. Description of the Background Art

FIG. 1 illustrates a known back bias voltage level detector. As shown therein, the known back bias voltage level detection includes resistors R1 and R2 connected in series between an electric voltage Vcc and a back bias voltage Vbb, and a comparator OP in which a node A connected with each one terminal of the resistors $R_1$ and R2 is connected with a non-inverted terminal of the comparator OP and a reference voltage Vref is inputted into an inverted terminal of the same.

The operation of the known back bias voltage level detector will now be explained with reference to the accompanying drawings.

First, as shown in FIG. 1, the serially connected resistors $R_1$ and R2 serve to distribute the electric voltage Vcc and limit the electric voltage. Therefore, the voltage $V_1$ of the node A is obtained by the following equation 1, and the back bias voltage Vbb based on the voltage $V_1$ is obtained by the following equation 2.

$$V1 = \frac{R2}{R1+R2}(Vcc - Vbb) \quad \text{[Equation 1]}$$

$$Vbb = Vcc - \frac{R1+R2}{R2} * V1 \quad \text{[Equation 2]}$$

In addition, the comparator OP outputs the input voltage $V_1$ when the input voltage $V_1$ inputted into the non-inverted terminal of the comparator OP is identical with the reference voltage Vref, so that the back bias voltage is detected and outputted through an output terminal Vout.

FIG. 2 is a graph illustrating the variation of a back bias voltage level of the circuit of FIG. 1.

However, in the known back bias voltage level detector, if the electric voltage Vcc is varied, as shown in FIG. 2, the input voltage Vi inputted into the comparator OP is also varied thereby. Namely, in accordance with Equations 1 and 2, the input voltage V1 is varied proportionally to the electric voltage Vcc. Therefore, it is impossible to accurately detect the back bias voltage level.

SUMMARY OF THE INVENTION

Accordingly, it is an object of the present invention to provide a back bias voltage level detector which overcomes the aforementioned problems encountered in the background art.

It is another object of the present invention to provide a back bias voltage level detector which is capable of accurately detecting a back bias voltage level by constantly maintaining a voltage inputted into a comparator using a clamp circuit or a current mirror circuit.

To achieve the above objects, there is provided a back bias voltage level detector which includes a voltage controller for accurately detecting the back bias voltage and constantly maintaining a voltage inputted into the comparator wherein the back bias voltage level detector includes first and second resistors connected in series between an electric voltage and a back bias voltage for distributing a voltage inputted, a comparator comparing the voltage distributed and inputted thereinto with a reference voltage wherein a back bias voltage detector is provided for outputting a detection signal to the outside by judging that a predetermined back bias voltage is detected when the input voltage and the reference voltage are identical as a result of the comparison.

In order to accurately detect a back bias voltage, there is provided a clamp circuit or a current mirror circuit which is capable of constantly maintaining a voltage inputted into the comparator.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The back bias voltage level detector according to the present invention will be explained with reference to the accompanying drawings.

Figure 1:
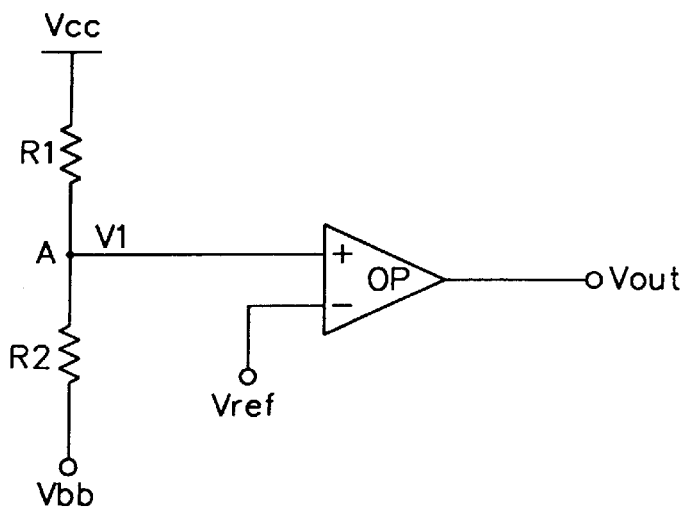
FIG. 1 is a circuit diagram illustrating a known back bias voltage level detector.
Figure 2:
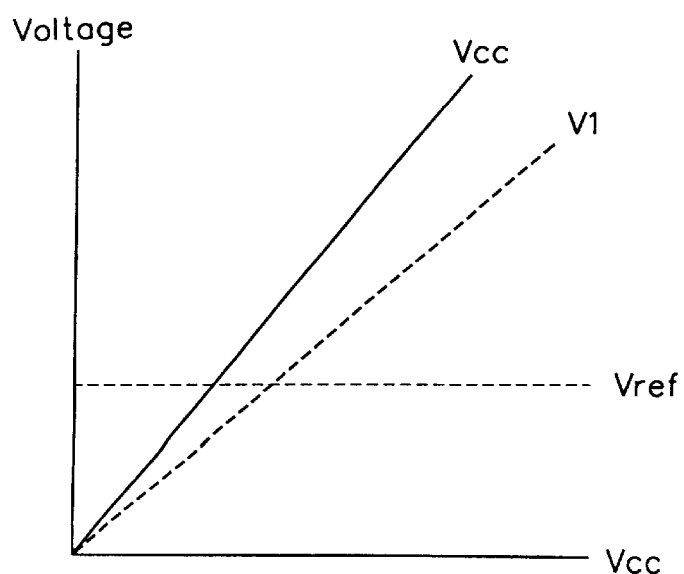
FIG. 2 is a graph illustrating the variation of a back bias voltage level of the circuit of FIG. 1.
Figure 3:
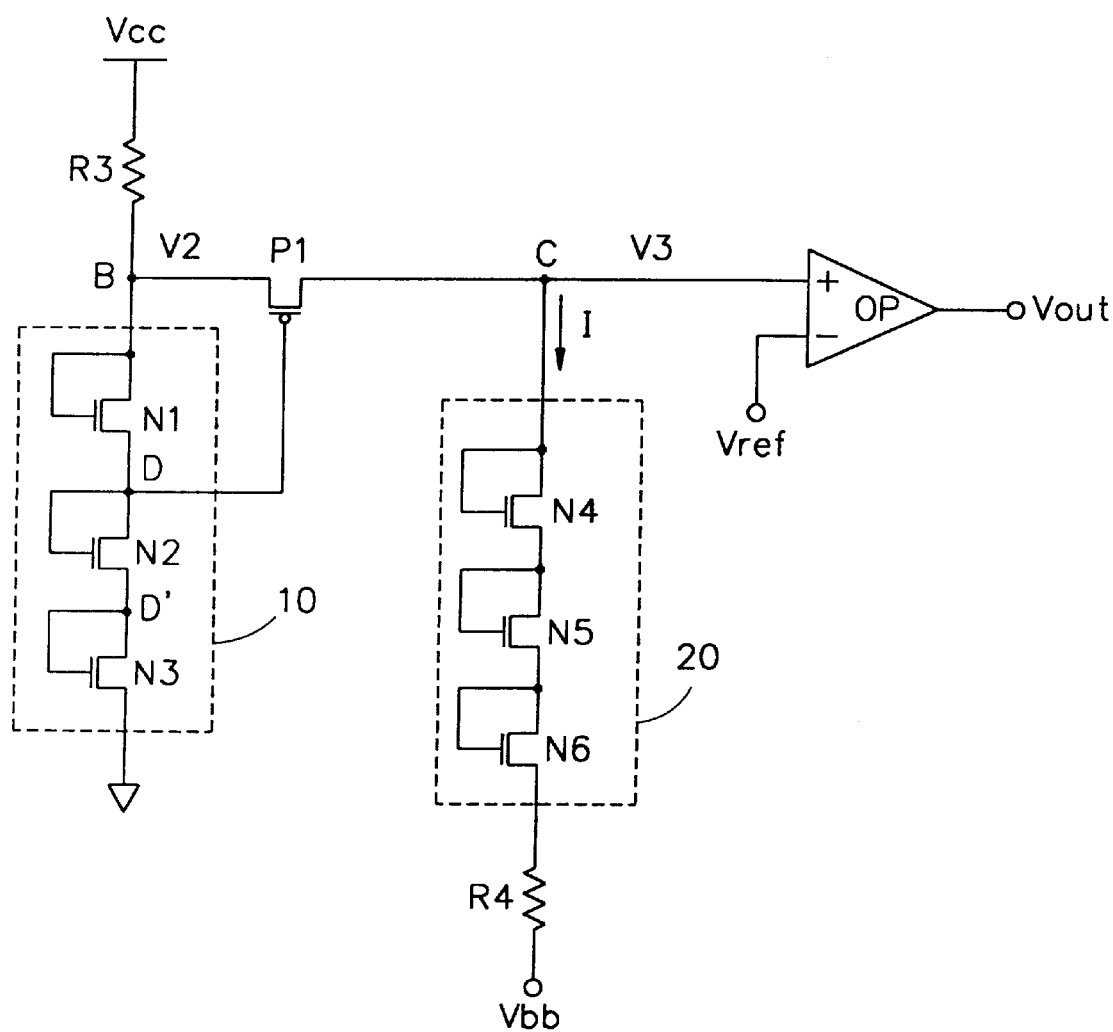
FIG. 3 is a circuit diagram illustrating a back bias voltage level detector according to a first embodiment of the present invention.

As shown in FIG. 3, the back bias voltage level detector according to a first embodiment of the present invention includes a first resistor R3 connected to one end of an electric voltage for dropping the electric voltage Vcc, a clamp unit 10 connected between the other end of the first resistor R3 and a ground voltage Vss for constantly maintaining the voltage of a first node B connected with the first resistor R3, a PMOS transistor P1 the source of which is connected with the first node B connected with the clamp unit 10 and the first resistor R3, respectively, for being switched in accordance with an output signal from the clamping unit 10 and bypassing the voltage V2 applied from the first node B, a reverse voltage prevention unit 20 connected with the drain of the PMOS transistor P1 for dropping the voltage V2 inputted through the PMOS transistor P1 and preventing a predetermined loss of other devices due to the reverse voltage, a second resistor R4 one end of which is connected with the reverse voltage prevention unit 20, and the other end of which receives a back bias voltage Vbb, and a comparator OP a non-inverted terminal (+) of which receives a voltage V3 of the second node C connected with the reverse voltage prevention unit 20 and the drain of the PMOS transistor P1, respectively, and an inverted terminal (−) of which receives an externally inputted reference voltage Vref for comparing the voltage V3 of the second node C and the reference voltage Vref and then outputting to the outside.

The clamping unit 10 includes first through third NMOS transistors N1 through N3 connected in series between the first node B and the ground voltage Vss, in which the drains and gates of which are connected with each other.

Here, the third node D connected with the first NMOS transistor N1 and the second NMOS transistor N2 is connected with the gate of the PMOS transistor P1, and the number of the NMOS transistors N1 through N3 is determined based on the voltage level to be detected.

In the reverse voltage prevention unit 20, the fourth through sixth NMOS transistors N4 through N6 in which the drains and gates are connected with each other are connected in series with the second node C.

The number of the fourth through sixth NMOS transistors N1 through N3 or the resistor R4 is determined based on the level of the reference voltage Vref, and an NMOS transistor which has a diode characteristic is used based on the loss of the other devices due to the over voltage when the electric voltage is first tuned on.

The operation of the back bias voltage level detector according to a first embodiment of the present invention will now be explained.

First, the electric voltage Vcc is distributed by the first resistor R3 and the NMOS transistors N1 through N3 and is dropped, and the voltage V2 of the first node B is constantly maintained by the clamping unit 10. In addition, the voltage V2 of the first node B may be expressed as a sum of the turning-on voltages (threshold voltages) of the first through third NMOS transistors N1 through N3 of the clamping unit 10.

[Equation 3]

$$V2 = Vt_{N1} + Vt_{N2} + Vt_{N3}$$

Namely, the clamping unit 10 constantly maintains the voltage V2 of the first node B irrespective of the variation of the electric voltage Vcc.

The PMOS transistor P1 is turned on or off in accordance with the output signal from the clamping unit 10, so that the voltage V2 of the first node B is bypassed to the second node C.

Here, the output node D of the clamping unit 10 may be changed to another output node D'.

The voltage V3 of the second node C is dropped to a predetermined voltage level for being corresponded with the reference voltage Vref (for example, 2V) by the reverse voltage prevention unit 20 and the second resistor R4 until the back bias voltage Vbb becomes a predetermined voltage level.

Here, the back bias voltage Vbb is applied from an externally connected back bias voltage generator (not shown), and when the electric power is first turned on, the back bias voltage Vbb becomes a ground level Vss and then gradually becomes a predetermined voltage level (for example, −1.5V).

In addition, the voltage V3 of the second node C which is dropped to a predetermined voltage level by the reverse voltage prevention unit 20 and the second resistor R4 is inputted into the comparator OP. Here, the above-described voltage level is determined by a user, and the user may vary the number of the NMOS transistors of the reverse voltage prevention unit 20 and the resistors.

The comparator OP compares the input voltage V3 with the reference voltage Vref. As a result of the comparison, if a predetermined voltage is inputted, it is judged that the back bias voltage is detected. Therefore, the voltage V3 is outputted to the outside.

The above-described operation will be explained in more detail.

Assuming that the voltage applied to the second node C through the PMOS transistor P1 is 2.5V, and the reference voltage Vref is 2V, and the back bias voltage Vbb to be detected by the user is −1.5V, when the electric voltage is first turned on, the back bias voltage Vbb applied from the externally connected back bias voltage generator (not shown) has a level of the ground voltage Vss. At this time, the voltage V3 (2.5V) of the second node C is dropped by the reverse voltage prevention unit 20 and the second resistor R4 until the back bias voltage Vbb becomes a predetermined voltage level.

After a predetermined time is elapsed, when the back bias voltage Vbb becomes a voltage level (−1.5V) (at this time, the voltage V3 of the second node C is dropped to about 2V. here, the reverse voltage prevention unit 20 and the second resistor R4 are determined by a user in accordance with the reference voltage Vref), the voltage V3 of the second node C is inputted into the comparator OP, and the comparator OP compares the voltage V3 with the reference voltage Vref. As a result of the comparison, if a desired voltage is obtained, a signal which denotes that the back bias voltage Vbb is detected is outputted to the outside. Namely, the voltage V3 of the second node C is outputted to the outside. On the contrary, as a result of the comparison, if the voltage is not a desired voltage, no signal is outputted to the outside.

[Equation 4]

$$V3 = Vbb + Vt_{N4} + Vt_{N5} + Vt_{N6} + I*R4$$

Therefore, the voltage V3 of the second node C maintains a constant voltage level irrespective of the variation of the electric voltage Vcc.

As described above, in the first embodiment of the present invention, it is possible to accurately detect the back bias voltage by constantly maintaining an input voltage using the clamp circuit.

The back bias voltage level detector according to a second embodiment of the present invention will now be explained with reference to the accompanying drawings.

Figure 5:
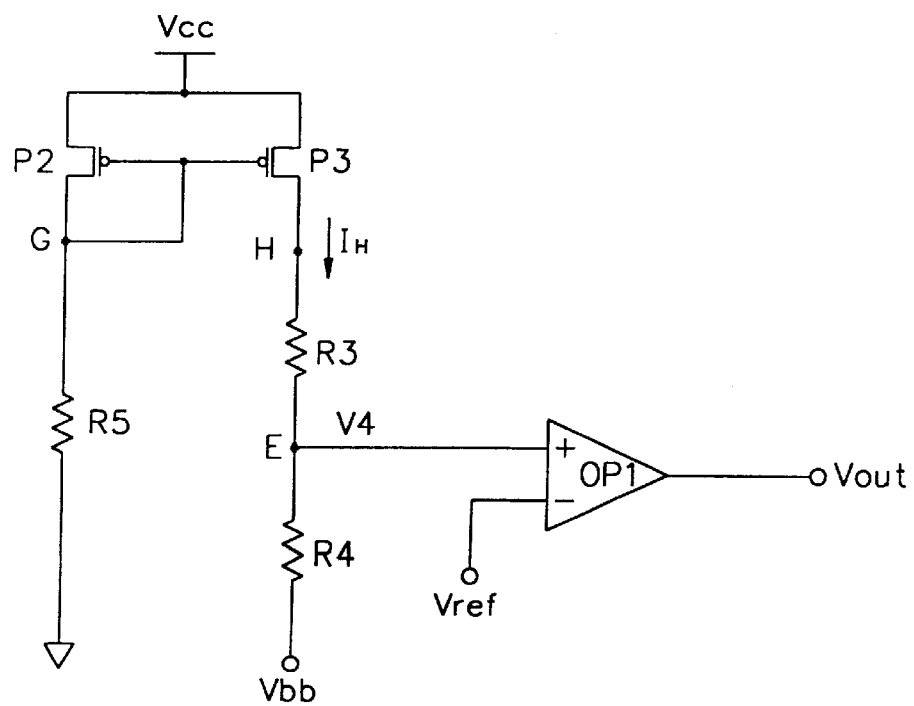
FIG. 5 is a circuit diagram illustrating a back bias voltage level detector according to a second embodiment of the present invention.

As shown in FIG. 5, the back bias voltage level detector according to a second embodiment of the present invention includes a second PMOS transistor P2 and a third PMOS transistor P3 the sources of which are parallely connected with an electric voltage Vcc and the gates of which are connected with each other, a third resistor R5 one end of which is connected with the drain of the second PMOS transistor P2 and the other end of which receives a ground voltage Vss, first and second resistors connected in series between the drain of the third PMOS transistor P3 and the back bias voltage Vbb, and a comparator OP1 a non-inverted terminal of which is connected with the fourth node E connected with the first and second resistors R3 and R4 and an inverted terminal of which receives an externally inputted reference voltage Vref for comparing the voltage V4 of the fourth node E with the reference voltage Vref and outputting to the outside.

In addition, the fifth node F connected with the gates of the second PMOS transistor P2 and the third PMOS transistor P3 is connected with the drain (the sixth node G) of the second PMOS transistor P2 for thereby configuring a current mirror circuit.

The operation of the second embodiment of the present invention will now be explained with reference to the accompanying drawings.

When the second PMOS transistor P2 and the third PMOS transistor P3 are turned on by the ground voltage Vss from the ground terminal at the initial stage, the current flowing from the electric voltage Vcc terminal to the seventh node H connected with the drain of the third PMOS transistor P3 and the first resistor R3 through the third PMOS transistor P3 is identical with the current flowing from the electric voltage Vcc to the third resistor R5 through the second PMOS transistor P2 and is maintained by the operation of the current mirror circuit.

Namely, the current flowing on the second node H is increased, the voltage applied from the second PMOS transistor P2 is applied to the gates of the second PMOS transistor P2 and the third PMOS transistor P3, and the transistors are turned off, so that the current of the seventh node H is decreased. In addition, when the current flowing on the seventh node H is decreased, the voltage applied from the second PMOS transistor P2 is dropped by the third resistor R5. The thusly dropped voltage causes to the second PMOS transistor P2 and the third PMOS transistor P3 to be turned on, so that the current of the seventh node H is increased. Therefore, the current of the seventh node H constantly flows. In addition, the voltage becomes constant.

Here, the current of the seventh node H may be controlled by a user. In more detail, a resistor which is identical with the third resistor R5 is connected in series between the third resistor R5 and the ground voltage Vss for controlling the current flow.

The voltage of the seventh node H is divided by the first resistor R3 and the second resistor R4, and the voltage of the fifth node E is obtained by the following equation 5.

$$V4 = \frac{R3}{R3+R4}(I_H R' - Vbb) \quad \text{[Equation 5]}$$

Here, the current $I_H$ denotes the current value flowing on the second node H, and the resistor R' denotes an internal resistance of the second node H.

Figure 4:
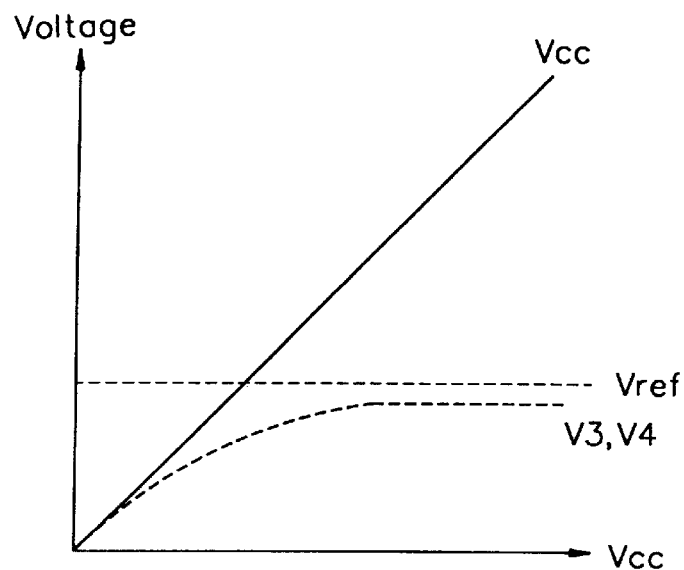
FIG. 4 is a graph illustrating the variation of a back bias voltage level according to the present invention.

Therefore, the voltage inputted into the comparator OP1 is constantly maintained as shown in FIG. 4 irrespective of the variation of the electric voltage Vcc. Namely, the comparator OP1 detects the back bias voltage irrespective of the variation of the electric voltage Vcc.

As described above, it is possible to accurately detect the back bias voltage by constantly maintaining the voltage inputted into the comparator using the current mirror circuit which is provided in accordance with the second embodiment of the present invention.

Accordingly, in the present invention, it is possible to accurately detect the back bias voltage irrespective of the variation of the electric voltage Vcc by constantly maintaining the voltage inputted into the comparator using a clamp circuit or a current mirror circuit even when the electric voltage Vcc is varied.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. A back bias voltage level detector comprising:
    first resistor for coupling with an electric voltage to distribute a first voltage;
    a second resistor for coupling with a back bias voltage;
    a voltage control circuit coupled to the first and second resistors that maintains the distributed first voltage, and provides a second voltage; and
    a comparator coupled to the voltage control circuit that compares the second voltage with a reference voltage, and outputs a detection signal when the second voltage is substantially identical to the reference voltage,
    wherein said voltage control circuit includes:
        a clamp coupled to the first resistor that maintains the first voltage and provides a control signal,
        a switch, coupled to the clamp, that allocates the maintained first voltage based on the control signal, and
        a reverse voltage prevention circuit connected between the switch and the second resistor, that adjusts the maintained first voltage from the switch to provide the second voltage for corresponding with the reference voltage.

2. The detector of claim 1, wherein the clamp includes:
    a first transistor having a drain and a gate which receive the electric voltage dropped by the first resistor;
    a second transistor having a drain and a gate which are connected with a source of the first transistor; and
    a third transistor having a drain and a gate which are connected with a source of the second transistor, and including a source for coupling to a ground voltage.

3. The detector of claim 1, wherein said switch includes a transistor having a source which receives the first voltage, and a gate which receives the control signal from the clamp.

4. The detector of claim 1, wherein said reverse voltage prevention circuits includes:
    a first transistor having a drain and a gate which are commonly connected with the switch and the comparator;
    a second transistor having a drain and a gate which are commonly connected with a source of the first transistor; and
    a third transistor having a drain and a gate which are commonly connected with a source of the second transistors and including a source which is connected with the second resistor.

5. A back bias voltage level detector comprising:
    a first resistor for coupling to an electric voltage to distribute a first voltage;
    a voltage controller for coupling to a back bias voltage and coupled to the first resistor to maintain the distributed first voltage, and provides a second voltage; and
    a comparator coupled to the voltage controller that compares the second voltage with a reference voltage, and outputs a detection signal when the second voltage is substantially identical to the reference voltage,
    wherein said voltage controller includes a clamp coupled to the first resistor to constantly maintain the first voltage and provides a control signal, and a switch coupled to the comparator and responsive to the control signal.

6. The detector of claim 5, wherein said voltage controller further includes:
    a reverse voltage prevention circuit, coupled to the switch, that adjusts the maintained first voltage such that the second voltage corresponds with the reference voltage; and
    a second resistor coupled to said reverse voltage prevention circuit and for coupling to the back bias voltage.

7. The detector of claim 5, wherein the clamp includes a plurality of first transistors connected in series, each of the first transistors having a drain and a gate commonly connected.

8. The detector of claim 7, wherein said switch is a second transistor having a source which receives the maintained first voltage, a gate which receives the control signal from the clamp and a drain coupled to the comparator.

9. The detector of claim 8, wherein said voltage controller further includes:
- a reverse voltage prevention circuit, coupled to the switch, that adjusts the maintained first voltage from the switch to provide the second voltage for corresponding with the reference voltage, the reverse voltage prevention circuit including a plurality of third transistors connected in series, each of the third transistors having a drain and a gate commonly connected; and
- a second resistor coupled to the reverse voltage prevention circuit and the back bias voltage.

10. The detector of claim 5, wherein the switch is coupled to the clamp and allocates the maintained first voltage based on the control signal of the clamp.

11. The detector of claim 10, wherein the switch is a transistor having a source coupled to the clamp, a gate which receives the control signal from the clamp, and a drain coupled to the comparator.

12. A back bias voltage level detector comprising:
- a first resistor for coupling with an electric voltage to distribute a first voltage;
- a voltage controller for coupling to a back bias voltage and coupled to the first resistor to maintain the distributed first voltage and to provide a second voltage; and
- a comparator coupled to the voltage controller to compare the second voltage with a reference voltage, and outputs a detection signal when the second voltage is substantially identical to the reference voltage,
- wherein said voltage controller includes a reverse voltage prevention circuit coupled to the comparator to adjust the maintained first voltage such that the second voltage corresponds with the reference voltage, and
- wherein said voltage controller further includes:
  - a transistor coupled to the first resistor and the comparator;
  - a clamp coupled to the first resistor and providing a control signal for controlling the transistor; and
  - a second resistor coupled to said reverse voltage prevention circuit and for coupling to the back bias voltage.

13. The detector of claim 12, wherein the reverse voltage prevention circuit includes a plurality of first transistors connected in series, each of the first transistors having a drain and a gate commonly connected.

14. The detector of claim 12, wherein the voltage controller further includes a second resistor coupled to said reverse voltage prevention circuit and for coupling to the back bias voltage.

15. A back bias voltage level detector comprising:
- a first resistor for coupling with an electric voltage to distribute a first voltage;
- a voltage controller for coupling to a back bias voltage and coupled to the first resistor to maintain the distributed first voltage and to provide a second voltage; and
- a comparator coupled to the voltage controller to compare the second voltage with a reference voltage, and outputs a detection signal when the second voltage is substantially identical to the reference voltage,
- wherein said voltage controller includes a reverse voltage prevention circuit coupled to the comparator to adjust the maintained first voltage such that the second voltage corresponds with the reference voltage, and
- wherein said voltage controller further includes a switch coupled between the first resistor and the reverse voltage prevention circuit.

* * * * *